United States Patent [19]

Adachi et al.

[11] 4,302,674
[45] Nov. 24, 1981

[54] INFRARED RADIATION DETECTING APPARATUS AND METHOD OF MANUFACTURING IT

[75] Inventors: Hideo Adachi, Kyoto; Kiichi Minai, Shiga, both of Japan

[73] Assignee: Murata Manufacturing Co., Ltd., Japan

[21] Appl. No.: 32,916

[22] Filed: Apr. 24, 1979

[30] Foreign Application Priority Data

May 8, 1978 [JP] Japan ................................. 53/54792

[51] Int. Cl.³ .......................... G01J 1/00; H04N 9/27; G01J 1/42
[52] U.S. Cl. .................... 250/338; 250/342; 357/72
[58] Field of Search .................. 250/338, 342, 352; 29/592, 424; 310/312; 357/72

[56] References Cited

U.S. PATENT DOCUMENTS

| | | | |
|---|---|---|---|
| 3,098,380 | 7/1963 | Suomi et al. | 250/338 |
| 3,539,803 | 11/1970 | Beerman | 250/338 |
| 4,001,863 | 1/1977 | Kobayashi et al. | 357/72 |
| 4,044,251 | 8/1977 | Taylor et al. | 250/338 |

Primary Examiner—Alfred E. Smith
Assistant Examiner—Janice A. Howell
Attorney, Agent, or Firm—Ostrolenk, Faber, Gerb & Soffen

[57] ABSTRACT

An infrared radiation sensing device such as a pyroelectric effect device is mounted on one surface of an insulating substrate of alumina ceramic or the like. External connection leads are provided on the insulating substrate. A hollow cylindrical member is mounted on its end on the radiation receiving surface of the infrared radiation sensing device. A field effect transistor is provided on the other surface of the insulating substrate for amplifying the signal generated in the sensing device by incident infrared radiation. The apparatus is suitably encapsulated in a layer of resin.

42 Claims, 16 Drawing Figures

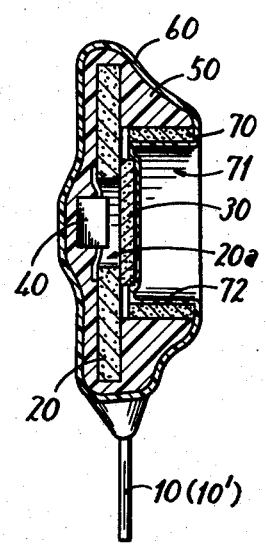
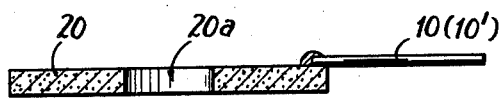
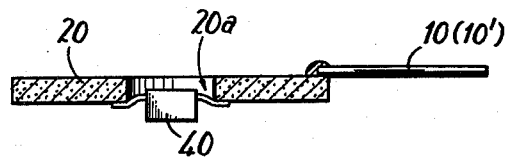
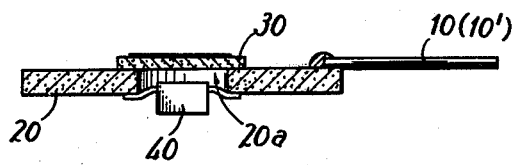
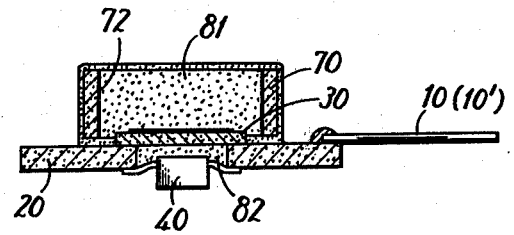

INFRARED RADIATION DETECTING APPARATUS AND METHOD OF MANUFACTURING IT

BACKGROUND OF THE INVENTION

1. Field of the Invention

The present invention relates to an infrared radiation detecting apparatus and a method for manufacturing it. More specifically, the present invention relates to a thermal type infrared radiation detecting apparatus employing an infrared radiation sensing device of a pyroelectric effect type and completed with a novel package structure and a method for manufacturing it.

2. Description of the Prior Art

A thermal type infrared radiation detecting apparatus employing a pyroelectric effect type sensing device, such as the thermistor bolometer and the like, is in common use. FIG. 1 shows a sectional view of an infrared radiation detecting apparatus employing a prior art thermal type sensing device, which constitutes the background of the invention. The conventional infrared radiation detecting apparatus shown in FIG. 1 comprises an insulating substrate 2, external connection pins 1 and 1' and fixed to and penetrating the thickness of the insulating substrate 2, an infrared radiation sensing device 3 provided on the insulating substrate 2, and a separated base 5 from the insulating substrate 2 by a spacer 4. A metallic casing 6 having an aperture 6a for receiving infrared radiation is hermetically sealed to the base 5 so as to enclose the insulating substrate 2. The aperture 6a of the metallic casing 6 is provided with a window member 7 of a material transmits infrared radiation of a desired wavelength region.

As is well known, a package of such a structure acts as an electric shield because the casing is metallic. In addition, such a package is mechanically strong. Nevertheless, a thermal type infrared radiation detecting apparatus employing such a package suffers from various shortcomings. First, since such a package structure is expensive, such a package can be employed only in infrared radiation detecting apparatuses for particular applications which allow a high cost. Secondly, such a package structure makes it difficult to implement the so-called longitudinal structure, in which the external connection leads extend parallel to the substrate. Thirdly, such a package structure makes it difficult to employ flexible insulated lead wires as external connection leads. As the fourth disadvantage, since the casing is metallic, when the window member of a resinous material such as polyethylene is adhered to the opening 6a by means of an adhesive agent, the adhesive agent comes into contact with the infrared radiation transmitting portion of the window member, which causes variability in the sensitivity of the detecting apparatus and degrades the manufacturing efficiency. As the fifth disadvantage, since the heat capacity of the metallic casing is relatively large, dew is deposited on the surface of the casing when the ambient temperature of the detecting apparatus suddenly changes from low to high. Dew on the window member can interrupt the incident infrared radiation, the moisture can enter through the interface between the window member and the casing. As the sixth disadvantage, since the metallic casing is a good conductor of heat, and usually the substrate for supporting the sensing device is made of alumina which is also a good conductor of heat, any contact between the casing and the substrate accidentally occuring during assembly, makes it difficult to detect slowly varying infrared radiation energy. As the seventh disadvantage, the metallic casing makes the package unavoidably bulky and difficult to miniaturize. As the eighth disadvantage, in the case where a field effect transistor is housed in the casing as a subsequent stage of the sensing device for the purpose of impedance conversion and amplification of the detected signal, it is required that the field effect transistor be coated with a resinous material in order to prevent the field effect transistor by being adversely affected from the moisture entering the casing, since a commercially available field effect transistors resist moisture poorly.

SUMMARY OF THE INVENTION

Briefly described, the present invention comprises an infrared radiation detecting apparatus wherein the radiation receiving portion of an infrared radiation sensing device is surrounded by a cylindrical wall and is coated with an insulating material on the surface of the infrared radiation sensing device excluding a space inside the cylindrical member defining the radiation receiving portion of the infrared radiation sensing device and a portion for external connection leads for externally withdrawing an electrical signal obtained from the infrared radiation sensing device. More preferably, the above described infrared radiation detecting apparatus is further coated with a resin material transmissible of infrared radiation of a predetermined wavelength region on the surface of the above described infrared radiation detecting apparatus including the radiation receiving portion and thus the space inside the cylindrical member.

According to the present invention, an infrared radiation detecting apparatus can be inexpensively mass-produced with high efficiency, while the freedom of choosing the shape and structure of the apparatus is increased. More specifically, the present invention readily enables a socalled longitudinal type wherein external connection leads are withdrawn to extend in parallel with the radiation receiving surface of the detecting apparatus, a so-called lateral type wherein external connection leads are withdrawn to extend in the direction normal to the radiation receiving surface of the detecting apparatus, employment of a flexible insulated lead wire as external connection leads, and the like. As a result, an improved infrared radiation detecting apparatus can be provided wherein designing flexibility in enhanced and the geometry suited for fixing the same is employed. In addition, according to the present invention, an infrared radiation detecting apparatus can be manufactured without any fear that an adhesive agent and the like flows up to the radiation receiving surface of the infrared radiation sensing device, which enhances efficiency of fabricating work. Since according to the present invention an enclosure of the detecting apparatus is made of a synthetic resinous material, an abrupt change of the ambient temperature does not cause deposition of dew on the enclosure, which eliminates any unfavorable influence on infrared radiation detection because of deposition of dew. In addition, since a cylindrical member is provided on the radiation receiving portion of the infrared radiation sensing device, a drift of the detected signal by virtue of incidence of undesired infrared radiation is decreased, thereby to enable detection of only desired radiation with certainty.

Accordingly, a principal object of the present invention is to provide an infrared radiation detecting apparatus with an improved package structure.

Another object of the present invention is to provide an infrared radiation detecting apparatus of a novel package structure wherein a drift of a detected signal by virtue of incidence of undesired infrared radiation is reduced.

A further object of the present invention is to provide a method for manufacturing an infrared radiation detecting apparatus with an improved package.

These objects and other objects, features, aspects and advantages of the present invention will become more apparent from the following detailed description of the present invention, when taken in conjunction with the accompanying drawings.

BRIEF DESCRIPTION OF THE DRAWINGS

FIG. 4 shows a sectional view of another embodiment of the present invention;

FIGS. 6 to 11 each show sectional views of the FIG. 2 embodiment at several stages of the manufacturing process thereof;

FIGS. 12A and 12B show an example of an insulating substrate for use in the present invention, wherein FIGS. 12A and 12B show a front surface and a rear surface thereof, respectively;

FIGS. 14A and 14B show an arrangement of an infrared radiation sensing device on an insulating substrate and thus the relation between a pyroelectric infrared radiation sensing device and a field effect transistor after the process step shown in FIG. 8, wherein FIGS. 14A and 14B show a front surface and a rear surface thereof, respectively.

DESCRIPTION OF THE PREFERRED EMBODIMENTS

Prior to a detailed description of the preferred embodiments of the present invention, it is pointed out that although in the following the present invention will be described specifically as embodied in an infrared radiation detecting apparatus employing a thermal type infrared radiation sensing device, such as a pyroelectric effect sensing device formed in a chip of $LiTaO_3$, $PbTiO_3$, SBN, PZT and the like, the present invention can be equally well employed in any other thermal type infrared radiation sensing device, such as those of a composite oxide of Ni, Co, Mn, Cu, Fe and the like formed in a flake shape, a composite comprising a substrate and a thick or a thin film of such composite oxide deposited thereon, i.e. a thermistor bolometer. It is further pointed out that the present invention can be employed in an infrared radiation detecting apparatus employing a photoelectric converting semiconductor device for converting infrared radiation into an electrical signal.

Figure 1:
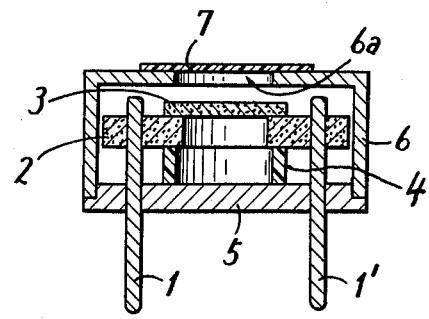
FIG. 1 shows a sectional view of a conventional thermal type infrared radiation detecting apparatus, which constitutes the background of the present invention.
Figure 2:
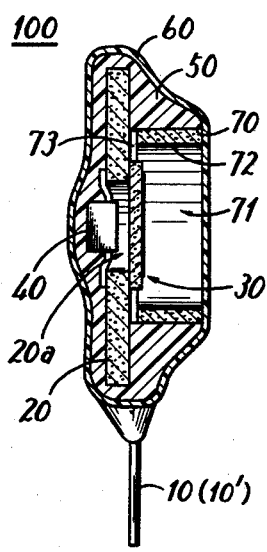
FIG. 2 is a sectional view of one embodiment of a thermal type infrared radiation detecting apparatus in accordance with the present invention.

FIG. 2 shows a sectional view of one embodiment of the present invention. The embodiment shown comprises an insulating substrate 20 made of alumina ceramic, for example. An infrared radiation sensing device 30 is provided on one main surface of the insulating substrate 20 at the central portion thereof. The insulating substrate 20 may be formed with an aperture 20a at the central portion thereof underneath the infrared radiation sensing device 30 for decreasing heat dissipation of the infrared radiation sensing device 30. Thus, the aperture 20a is formed to decrease the effectiveness of substrate 20 as a heat sink for the infrared radiation sensing device 30. Therefore the aperture 20a can be dispensed with by interposing a heat insulating spacer between the infrared radiation sensing device 30 and the insulating substrate 20. However, in the embodiment shown, the aperture 20a is also advantageously used for accommodating a field effect transistor 40 as well as for decreasing heat dissipation of the infrared radiation sensing device 30, as described above, thereby to effectively decrease the total thickness of the inventive infrared detecting apparatus. Pin-like external connection leads 10 and 10' are fixed to the insulating substrate 20 so as to extend through periphery of the insulating substrate 20. These external connection leads 10 and 10' may be made of a highly conductive metallic material such as copper. As briefly described previously, the infrared radiation sensing device 30 is fixed with an electrically conductive adhesive agent to one surface of the insulating substrate 20 so as to cover the aperture 20a.

Figure 13:
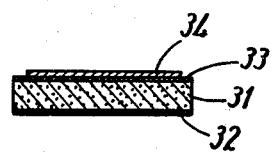
FIG. 13 is a sectional view of a pyroelectric effect type infrared radiation sensing device for use in an embodiment of the present invention.

The infrared radiation sensing device 30 may be a pyroelectric effect sensing device, for example, and is structured, in section, as shown in FIG. 13. More specifically, referring to FIG. 13, the infrared radiation sensing device 30 comprises a ceramic substrate 31 made of e.g. $PbTiO_3$, electrodes 32 and 33 deposited on both main surfaces of the ceramic substrate 31, and a black film 34 of e.g. carbon black deposited on the surface of one electrode 33. The ceramic substrate 31 is polarized to afford it a pyroelectric effect, through application of a voltage between the electrodes 32 and 33. The black film 34 constitutes a radiation receiving surface for effectively receiving and absorbing infrared radiation. Accordingly, it will be appreciated that the infrared radiation sensing device 30 should be fixed to one main surface of the insulating substrate 20 so that the radiation receiving surface, i.e. the black film 34, is exposed.

Figure 3:
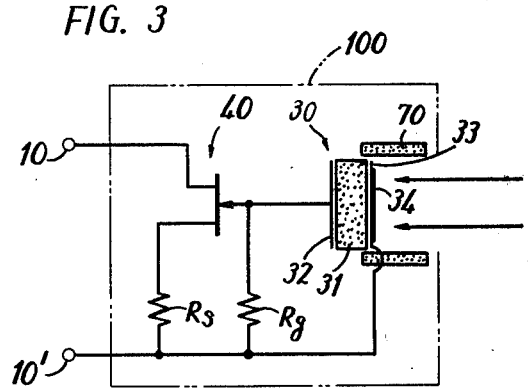
FIG. 3 is a schematic diagram of an equivalent circuit of the FIG. 2 embodiment.

A field effect transistor 40 is connected and fixed to the other main surface of the insulating substrate 20 by lead wires, and it is accommodated within the aperture 20a of the insulating substrate 20. In the case where no aperture 20a is provided, the field effect transistor 40 is simply provided on the other main surface of the insulating substrate 20. Although not shown in FIG. 2, the insulating substrate 20 has predetermined film resistor patterns formed on its surface, as will be more fully described subsequently with reference to FIGS. 12A and 12B. These resistor patterns serve as operating resistors for the field effect transistor 40, as shown in FIG. 3. The infrared radiation sensing device 30, the field effect transistor 40 and the operating resistors $R_g$ and $R_s$ are connected in the manner shown in FIG. 3. Although such connection is not specifically shown in FIG. 2, it will be described in more detail subsequently, with reference to FIGS. 12A and 12B to 14A and 14B.

A cylinder 70 for interrupting incidence of undesired infrared radiation is disposed on the radiation receiving surface or on the substrate 20 so that the radiation receiving portion of the sensing device 30 is located inside the cylinder 70. Preferably, the cylinder 70 is disposed with a spacing 73 from the surface of the substrate 20 as seen in the embodiment shown, although the cylinder 70 may be disposed directly on the surface of the substrate 20. Alternatively, the cylinder 70 may be disposed on the sensing device 30. Preferably the cylinder 70 is of a porous material, such as steatite ceramic, for example. The reason will be that, as is clear from a description to be made subsequently, a material such as wax is to be absorbed therein.

The external connection leads 10 and 10', the insulating substrate 20, the infrared radiation sensing device 30, the field effect transistor 40 and the cylinder 70 thus connected and fixed as described in the foregoing and as shown in FIGS. 2 and 3 are covered with a first resin layer 50, as shown in FIG. 2. More specifically, the first resin layer 50 is formed to cover the components 10, 10', 20, 30, 40 and 70, excluding a portion of the radiation receiving surface of the infrared radiation sensing device 30, a volume 71 defined by the cylinder 70, and the radiation receiving surface of sensing device 30, the volume of aperture 20a, and the tip ends of the external connection leads 10 and 10'. Preferably, the first resin layer 50 is made of phenol or epoxy porous insulating resin. However, it will be appreciated that if the cylinder 70 is made of a porous material, the first resin layer 50 need not be porous, as will be clear from the subsequent description.

The whole outer surface of the infrared radiation detecting apparatus 100 thus obtained is further coated with a second resin layer 60. The second resin layer 60 may be made of a resinous material transparent to infrared radiation of a predetermined wavelength region, such as paraffin resin, polyethylene, polypropylene or the like. As best seen in FIG. 2, the second resin layer 60 is formed so as to leave a space 71 between it and the radiation receiving surface of the sensing device 30. The space 71 serves to prevent the heat generated at the infrared radiation device 30 by incident infrared radiation from being dissipated outward through the second resin layer 60.

Since the cylinder 70 is provided on the radiation receiving surface of the infrared radiation sensing device 30, any infrared radiation incident upon the radiation receiving surface other than substantially perpendicularly is blocked by the cylinder 70. Thus, the sensing device 30 is relatively insensitive to infrared radiation incident nonperpendicularly and the drift of the signal obtained from the sensing device 30 is decreased. It has been observed that large drift of the detected signal could cause the infrared radiation detecting apparatus malfunction. Thus, it is preferable to encompass the radiation receiving surface of the infrared radiation sensing device 30 with the cylinder 70.

As shown in FIG. 2, formation of a black film on the inner wall of the cylinder 70 in the same manner as on the radiation receiving surface of the sensing device 30 serves to further suppress drift of the detected signal due to non-normally incident infrared radiation. Even if such radiation is incident upon the inner wall of the cylinder 70 in an undesired direction, it is absorbed by the black film 72 formed on the inner wall of the cylinder 70. Accordingly, such undesired infrared radiation does not reach the infrared radiation sensing device 30, with the result that drift of the detected signal is much decreased. A desired angle of vision can be achieved by an appropriate choice of the diameter of the cylinder 70. Since a narrower angle of vision increases detection sensitivity accordingly, the detection capability with respect to a specific target can be increased by narrowing the angle of vision.

If the field effect transistor 40 is better accommodated in part in the aperture 20a, as better seen in FIG. 2, then the infrared radiation detecting apparatus 100 as a whole can be made compact, and at the same time the field effect transistor 40 can be firmly and stably in place by and fixed covered with the first covering resin layer 50. Accordingly, the field effect transistor 40 is relatively immune to vibration or shock. In addition, the fact that the field effect transistor 40 is covered with the first and second covering resin layers 50 and 60 eliminates any necessity of providing a separate resin coating to the field effect transistor 40 for the specific purpose of making it moisture resistant. As a result, a small inexpensive field effect transistor can be employed.

In operation, when incident infrared radiation impinges on the infrared radiation detecting apparatus 100 thus then structured and connected as shown in FIG. 3, then the degree of polarization of the ceramic substrate 31 of the pyroelectric effect device, i.e. the infrared radiation sensing device 30, varies as a function of the amount of the incident infrared radiation to cause an electric charge to appear on the surfaces of the substrate 31, i.e. on the electrodes 32 and 33. The induced electric field undergoes impedance conversion and amplification by means of the field effect transistor 40, the output of which appears between the external connection leads 10 and 10'. Such pyroelectric effect type infrared detection has been fully described in PROCEEDINGS OF THE IEEE, VOL. 66, No. 1, "Pyroelectric Detectors and Materials", S. T. LIU et al. Infrared radiation can be detected by the inventive if its apparatus is in the wavelength region of 0.76 $\mu$m to 400 $\mu$m, generally defined as an infrared wavelength. However, the inventive apparatus can furthermore detect radiation of a wavelength slightly shorter than 0.76 $\mu$m.

FIG. 4 is a sectional view of another embodiment of the present invention. The FIG. 4 embodiment is different from the FIG. 2 embodiment in that the second resin layer 60 of the FIG. 4 embodiment is formed to cover the inner wall of the cylinder 70 and the radiation receiving surface of the infrared radiation sensing device 30. Since the remaining portions of the FIG. 4 embodiment are substantially the same as those of the FIG. 2 embodiment, it is not believed necessary to describe the FIG. 4 embodiment in more detail.

If the present invention is embodied as shown in FIGS. 2 and 4, with the external connection leads 10 and 10' parallel to the main surface of the insulating substrate 20 in the so-called longitudinal type structure, the detecting apparatus 100 can be advantageously used when it is to be fixed to a printed circuit board (not shown) so that the infrared radiation to be detected will be that traveling parallel to the printed circuit board.

Figure 5:
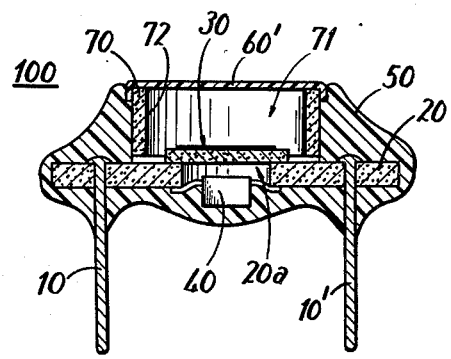
FIG. 5 is a sectional view of a further embodiment of the present invention.

FIG. 5 is a sectional view of a further embodiment of the present invention. A different feature of the FIG. 5 embodiment is that the external connection leads 10 and 10' are provided on one surface of the substrate 20 so as to extend through it vertically to the opposite surface of the insulating substrate 20. Since the volume 71 defined by the cylinder 70 is covered with a cover 60' of the same material as that of the second covering resin layer 60 of other embodiments, a second covering resin layer has been omitted. Again, the remaining portions of the FIG. 5 embodiment are substantially the same as those of the FIG. 2 embodiment so that it is not believed necessary to describe the FIG. 5 embodiment in more detail. It is pointed out that the infrared radiation detecting apparatus 100 of the so-called lateral type structure shown in FIG. 5 can be especially advantageously utilized in a situation where the detecting apparatus 100 is mounted on a printed circuit board (not shown) so that the incident infrared radiation to be detected is that traveling normal to the surface of the printed circuit board.

Electrical connection of each of the embodiments shown in FIGS. 4 and 5 may be made as shown in FIG. 3. Although in the above described embodiments relatively hard pin-like members are employed as external connection leads 10 and 10', flexible insulated lead wires may be used in place of such pin-like leads. An infrared radiation detecting apparatus employing flexible insulated lead wires may be especially advantageously employed in a situation where the detecting apparatus is mounted directly on a metal plate, for example. More specifically, assuming a case where the infrared radiation detecting apparatus employing pin-like leads as external connection leads is mounted directly to a metallic plate, since the two leads 10 and 10' could be short-circuited through the metallic plate, it is necessary to provide a short-circuit preventing means, such as an insulating spacer. On the other hand, if an infrared radiation detecting apparatus employing flexible insulated lead wires is employed in such a situation, the above described necessity of a shortcircuit preventing means is eliminated, while the freedom in mounting the detecting apparatus is increased as compared with a case of a detecting apparatus employing pin-like leads, with the result that the detecting apparatus can be mounted more compactly.

In case of any of the embodiments shown in FIGS. 2, 4 and 5, the infrared radiation sensing device 30 is fixed to the insulating substrate 20 with an electrically conductive adhesive agent and furthermore is firmly fixed in place by the first covering resin layer 50. Therefore, the sensing device 30 is stable and is little influenced by vibration and shock.

Now referring to FIGS. 6 to 11, a process for manufacturing the FIG. 2 infrared radiation detecting apparatus will be described in the following.

Figure 12A:
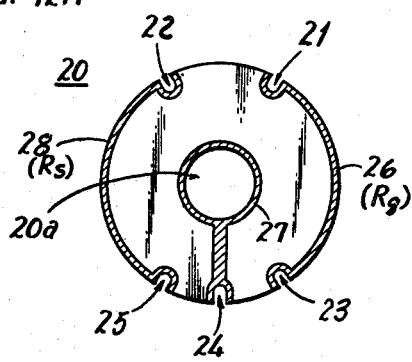
Figure 12B:
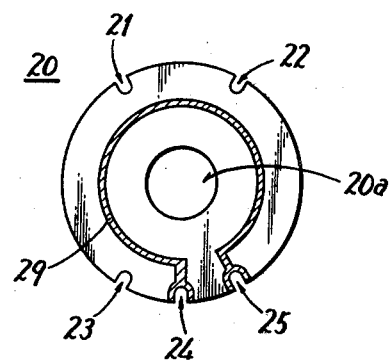

First referring to FIG. 6, an insulating substrate 20 with an aperture 20a is prepared. The insulating substrate 20 is shown in more detail in FIGS. 12A and 12B. FIG. 12A shows a plan view of one main surface of the insulating substrate 20 and FIG. 12B shows a plan view of the other main surface of the insulating substrate 20. As shown in FIGS. 12A and 12B, the insulating substrate 20 is formed with the above described aperture 20a in its central portion and with five notches 21, 22, 23, 24 and 25 at the periphery of the substrate 20. The notches 21, 22, and 24 are allotted for connecting lead wires of a field effect transistor 40, to be described subsequently, and the notches 23 and 25 are allotted for fixing the previously described external connection leads 10 and 10'. The notches 23 and 25 may be dispensed with if the leads 10 and 10' are mounted on the insulating substrate 20 parallel to its surface, as in the FIG. 2 embodiment. As best seen in FIG. 12A, a semicircular electrically conductive pattern is formed on one main surface to extend around each of the notches 21 to 25. As best seen in FIG. 12B, other electrically conductive patterns are formed on the other main surface of the substrate 20 so as to connect the notches 24 and 25. Again referring to FIG. 12A, a film resistor 26 serving as the above described operating resistor Rg is printed along the periphery of the substrate 20, connecting the above described electrically conductive patterns formed around the notches 21 and 23. Similarly, another film resistor 28 serving as the above described operating resistor Rs is formed along the periphery of the substrate 20 connecting the electrically conductive patterns formed around the notches 22 and 25. Referring to FIG. 12A, another electrically conductive pattern 27 is formed along the periphery of the aperture 20a on the same surface as the registors Rg and Rs and is electrically connected to the electrically conductive pattern formed around the notch 24. The conductive pattern 27 is electrically connected to the electrode 32 (see FIG. 13) when the sensing device 30 is fixed to the substrate 20, as will be described subsequently. Now referring to FIG. 12B, a further electrically conductive pattern 29 is formed on the other main surface of the substrate 20 in a circular strip with a diameter smaller than that of the substrate 20 and larger than that of the aperture 20a to form a connection between the conductive patterns formed around the notches 24 and 25. The insulating substrate 20 with the above described structure is prepared, and then the external connection leads 10 and 10' are fixed to portions of the notches 23 and 25 and are electrically connected and fixed to the conductive patterns formed around the notches 23 and 25.

Referring to FIG. 7, a field effect transistor 40 is fixed to the other main surface of the substrate 20, so that the field effect transistor 40 is in part accommodated in the aperture 20a. The gate electrode of the field effect transistor is electrically connected to the conductive pattern formed around the notch 24, the source electrode of the field effect transistor 40 is electrically connected to the conductive pattern formed around the notch 21, and the drain electrode of the field effect transistor 40 is electrically connected to the conductive pattern formed around the notch 22.

Figure 14A:
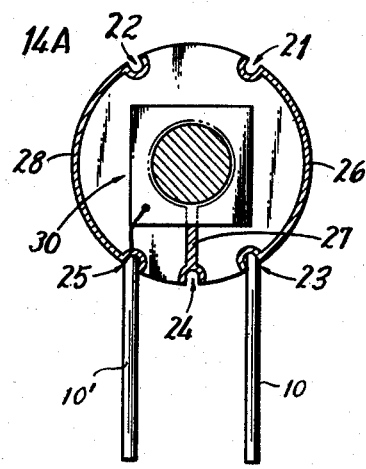
Figure 14B:
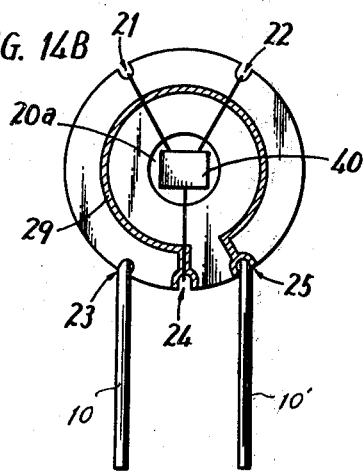

Referring now to FIG. 8, an infrared radiation sensing device 30 of such a structure as shown in FIG. 13 is fixed and electrically connected by the use of an electrically conductive adhesive agent to one main surface of the insulating substrate 20. As described previously, the infrared radiation sensing device 30 is placed such that the black film, i.e. the radiation receiving surface 34 of the sensing device 30, faces upward as viewed in FIG. 8, and then the electrode 32 is electrically connected to the conductive pattern 27 of the substrate 20. The electrically conductive adhesive agent may be one which contains as a major ingredient an electrically conductive material such as Ag, Ni, Au or the like. FIGS. 14A and 14B show plan views of one main surface and the other main surface of the FIG. 8 apparatus, respectively. As best seen in FIG. 14A, the electrode 33 of the infrared radiation sensing device 30 is electrically connected to the conductive pattern formed around the notch 23 by means of wire bonding. Thus, the respective electrical connection portions are formed as shown in FIG. 3.

Now referring to FIG. 9, a cylinder 70 enclosed with a heat responsive solid/fluid convertible material 81 is placed on the radiation receiving surface of the infrared rediation sensing device 30. A similar heat responsive solid/fluid convertible material 82 is filled into the aperture 20a of the insulating substrate 20. The above described heat responsive solid/fluid convertible materials 81 and 82 are preferably one which is a solid and will remain a given shape at normal temperature but is liquefied by being heated to an elevated temperature and is gasified by being heated to a further elevated temperature, such as wax, paraffin, vaseline or the like. However, the above described heat responsive solid/fluid convertible materials 81 and 82 may be one which is solid or semisolid at normal temperature and is sublimated when heated to an elevated temperature. The cylinder 70 is preferably of a porous material which will to absorb the above described heat responsive solid/fluid convertible material, such as steatite ceramic or the like. In the case where the heat responsive solid/fluid convertible materials 81 and 82 are wax, the wax is adhered to the surface of the cylinder 70 while being is heated to be liquefied. In such an instance, the cylinder 70 is temporarily fixed to the insulating substrate 20 or the infrared radiation sensing device 30 by means of the liquefied wax, which facilitates fabricating work and thus enhances efficiency of fabrication.

It should be pointed out that in the present application the term heat "responsive solid/fluid convertible material" has been used broadly to cover all materials which are solid or semisolid and will maintain a given shape at normal temperature but is liquified, gasified or sublimated at an elevated temperature. In this context, it is intended that the term "solid" include a semisolid state as well as a solid state. As a matter of practice, a space forming member is fabricated as follows. A heat responsive solid/fluid convertible material in a semisolid state is given a suitable shape determined by the desired final shape of volume 71 (see FIG. 9) and is then dried to a solid state. The space forming member thus obtained is disposed on the radiation receiving surface of the sensing device and 30, after the formation of the first resin layer 50, is heated to be liquefied, gasified or sublimated, by means of which phase change the material is removed.

Figure 10:
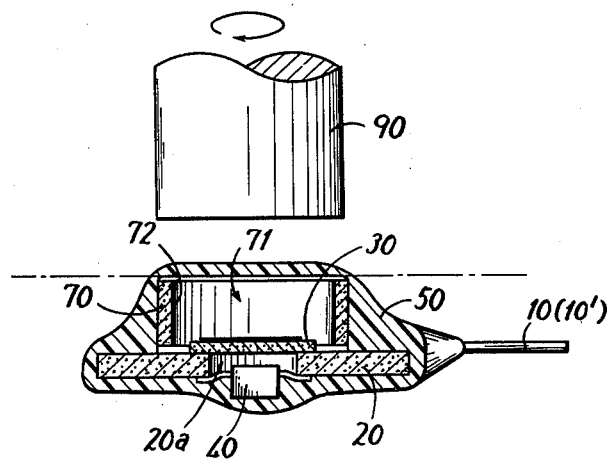

The apparatus as shown in FIG. 9 is then naturally dried or heat dried and is then dipped in a solution of a porous insulating resin material, such as phenol resin or epoxy resin, whereby a first covering resin layer 50 is formed on the apparatus, as shown in FIG. 10. After the first covering resin layer 50 is formed on the apparatus as shown in FIG. 10, the composite structure thus obtained is heated to liquefy gasify or sublimate the heat responsive solid/fluid convertible materials 81 and 82, which pass through the first coating porous resin layer 50 and/or cylinder 70 and are externally discharged. As a result, a space 71 is formed as shown in FIG. 10 where the solid/fluid convertible materials 81 and 82 (see FIG. 9) existed previously. A portion of the material 81 between the cylinder 70 and the layer 50 is absorbed into the layer 50 and/or the cylinder 70 with the result that each is fixed to each other without a gap between them. Although some of the material 81 is absorbed into the internal black film 72 of the cylinder 70, the radiation transmission of the material 81 is normally excellent over a wider range of wavelengths than is the case with the black film 72 itself, and hence no unfavorable influence is caused. Thereafter the portion of the first covering resin layer 50 formed above the cylinder 70 down the level shown by the dotted line in FIG. 10 is removed by means of a rotating grinder 90 having a flat grinding surface, so that the cylinder 70 and its volume 71 are exposed.

Figure 11:
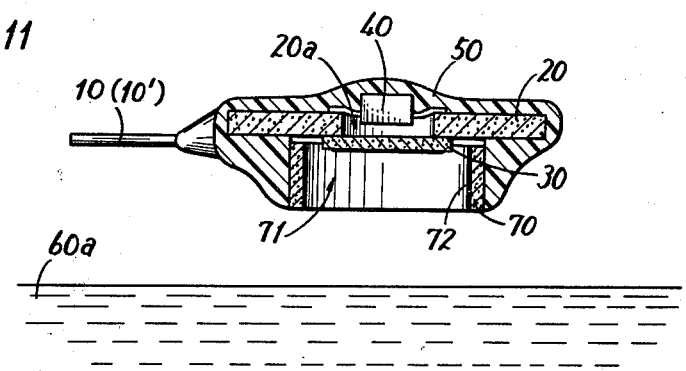

Referring to FIG. 11, the composite structure thus obtained is then dipped, with the side of the device from which the first covering resin layer 50 was removed facing downward into a solution 60a of an infrared radiation transmitting resin material such as polyethylene, whereby a second covering resin layer 60 is formed as shown in FIG. 2. Thus the infrared radiation detecting apparatus 100 of the invention is completed. The volume 71 defined by the cylinder 70 is thus left empty, as shown in FIG. 2 because of the surface tension of the resin solution 60a.

The first insulating cover layer 50 may be made of with a non-porous resin, if the material 82 is not used to fill in the aperture 20a of the insulating substrate 20 and if the cylinder 70 is made of a material capable of absorbing the liquefied solid/fluid convertible material 81 the remaining steps being the same as described above. Then the material 81 is absorbed into the cylinder 70. Since the aperture 20a of the insulating substrate 20 is relatively small, the resin of the first covering resin layer 50 will not enter the aperture 20a. (Even if the resin entered the aperture 20a, very little would enter, and no unfavorable influence of practical importance would result. In this case, the purpose of putting the solid/fluid convertible material 82 in the aperture 20a is merely to ensure that the aperture will be left empty.

Now returning to FIG. 4, in order to form the second covering resin layer 60 so that it is in contact with the infrared radiation sensing device 30, the composite structure is dipped into the resin solution 60a with the side opposite to the radiation receiving surface facing downward or the composite structure can be dipped as shown in FIG. 11 if the solution 60a is vibrated or stirred to prevent the resin from forming a film across the mouth of volume 71 as shown in FIG. 2.

The FIG. 5 embodiment of infrared radiation detecting apparatus 100 may be manufactured substantially the same as described with reference to FIGS. 6 to 11 with respect to the FIG. 2 infrared radiation detecting apparatus 100, with the sole difference that the external connection leads 10 and 10' are mounted in a different direction with respect to the substrate and that a cap 60' is substituted for the second resin layer 60. It is therefore not believed necessary to describe in detail the process for manufacturing the embodiment of FIG. 5.

Although in the foregoing the present invention was described as having one infrared radiation sensing device on one insulating substrate, alternatively two or more infrared radiation sensing devices may be provided on one insulating substrate, each mounted on a separate aperture.

If the infrared radiation sensing device 30 is made of ceramic, it can do double service as the insulating substrate 20, which can be dispensed with; hence the apparatus can be made more compact, the number of components is decreased and the manufacturing process can be simplified, as a result of which the infrared radiation detecting apparatus can be made less expensive. It should be noted that if the pyroelectric effect device 30 is used as the insulating substrate, the field effect transistor 40 simply be fixed to the rear surface of the sensing device 30 opposite to the radiation receiving surface.

Although the present invention has been described and illustrated in detail in connection with several preferred embodiments, many modifications and variations thereof will now be apparent to one skilled in the art, and the spirit and scope of the present invention are not to be limited by the details of the preferred embodi-

What is claimed is:

1. An infrared radiation detecting apparatus, comprising:
   a substrate made of an insulating material;
   a thermal type infrared radiation sensing device having first and second opposing main surfaces, said first main surface constituting a radiation receiving surface for providing, responsive to heat caused by incident infrared radiation impinging upon said radiation receiving surface, an electrical signal representative of the intensity of said incident infrared radiation; said second main surface of said thermal type infrared radiation sensing device being secured to said insulating substrate;
   an annular member secured to the combination of said insulating substrate and said thermal type infrared radiation sensing device so as to surround said radiation receiving surface for blocking infrared radiation approaching said radiation receiving surface at more than a predetermined angle from the normal;
   external connection lead means secured to said insulating substrate and in electrical contact with said thermal type infrared radiation sensing device;
   a first resin layer covering said thermal type infrared radiation sensing device except said radiation receiving surface, and covering said insulating substrate and a portion of said external connection lead means; and
   a second resin layer covering said radiation receiving surface, said second resin layer being transparent to infrared radiation having a wave length within a predetermined range.

2. An infrared radiation detecting apparatus in accordance with claim 1, wherein said first resin layer is made of a porous resin.

3. An infrared radiation detecting apparatus in accordance with claim 2, wherein said porous resin is thermosetting resin.

4. An infrared radiation detecting apparatus in accordance with claim 1, wherein said second resin layer is made of paraffin resin.

5. An infrared radiation detecting apparatus in accordance with claim 1, wherein said annular member has an inner and an outer surface and said second resin layer is formed in contact with said inner surface of said annular member and with radiation receiving surface of said infrared radiation sensing device means.

6. An infrared radiation detecting apparatus in accordance with claim 1, wherein said second resin layer covers but is formed spaced apart from said radiation receiving surface of said infrared radiation sensing device, whereby a space is formed that is defined between said second resin layer and said radiation receiving surface of said infrared radiation sensing device means.

7. An infrared radiation detecting apparatus in accordance with claim 1, wherein said thermal type device means comprises a thermistor bolometer.

8. An infrared radiation detecting apparatus in accordance with claim 1, wherein said thermal type device means comprises pyroelectric effect device means.

9. An infrared radiation detecting apparatus in accordance with claim 8, wherein said pyroelectric effect device means comprises:
   a ceramic plate having first and second opposing main surfaces;
   first and second electrode means formed on said first and second main surfaces of said ceramic plate, respectively; and
   a black film formed on said first electrode means, said first electrode means constituting said radiation receiving surface.

10. An infrared radiation detecting apparatus in accordance with claim 9, which further comprises field effect transistor means electrically connected to said pyroelectric effect device means for impedance conversion and amplification of said electrical signal; said field effect transistor means being electrically connected both to said first electrode means and to said external connection lead means, for amplifying said electrical signal and for providing said electrical signal to said external connection lead means; said first resin layer covering said field effect transistor means.

11. An infrared radiation detecting apparatus in accordance with claim 10 which further comprises operating resistor means electrically connected to said field effect transistor means, said operating resistor means being printed on said insulating substrate.

12. An infrared radiation detecting apparatus in accordance with claim 11, wherein said field effect transistor means is disposed on said second main surface of said insulating substrate.

13. An infrared radiation detecting apparatus in accordance with claim 12, whrein said insulating substrate has an aperture formed on said second main surface thereof, said field effect transistor means being accommodated in said aperture.

14. An infrared radiation detecting apparatus in accordance with claim 1, wherein said substrate has first and second opposing main planar surfaces, and wherein said external connection lead means are secured to said insulating substrate so as to extend in the direction normal to said main planar surfaces of said insulating substrate.

15. An infrared radiation detecting apparatus in accordance with claim 1, wherein said substrate has first and second opposing main planar surfaces, and wherein said external connection lead means are secured to said insulating substrate so as to extend parallel to said main planar surfaces of said insulating substrate.

16. An infrared radiation detecting apparatus in accordance with claim 1, wherein said external connection lead means comprises a flexible insulated lead wire.

17. An infrared radiation detecting apparatus in accordance with claim 1, wherein said annular member is made of a porous material.

18. An infrared radiation detecting apparatus in accordance with claim 17, wherein said porous material comprises a ceramic material.

19. An infrared radiation detecting apparatus in accordance with claim 1, wherein said annular member is disposed directly on said insulating substrate.

20. An infrared radiation detecting apparatus in accordance with claim 1, wherein said annular member is disposed directly on said infrared radiation sensing device.

21. An infrared radiation detecting apparatus in accordance with claim 1, wherein said annular member is disposed on said insulating substrate with a spacing therebetween.

22. An infrared radiation detecting apparatus in accordance with claim 1, wherein said annular member is disposed on said infrared radiation sensing device with a spacing therebetween.

23. An infrared radiation detecting apparatus in accordance with claim 1, wherein said thermal type infrared radiation sensing device means comprises photoelectric converting device means.

24. An infrared radiation detecting apparatus, comprising:

pyroelectric effect device means comprising a ceramic plate having first and second opposing main surfaces, first and second electrode means formed on said first and second main surfaces of said ceramic plate, respectively, and a radiation receiving layer of a heat absorbing material formed on said first electrode means for constituting a radiation receiving surface;

an annular member disposed on said pyroelectric effect device means so as to surround a portion of said pyroelectric effect device means including said radiation receiving surface for blocking infrared radiation approaching said radiation receiving surface at more than a predetermined angle from the normal;

external connection lead means secured to said pyroelectric effect device means and electrically connected to said electrode means of said pyroelectric effect device means;

a first resin layer covering said pyroelectric effect device means except for said portion of said pyroelectric device means surrounded by said annular member, and covering a portion of said external connection lead means; and a second resin layer covering said portion of said pyroelectric effect device means surrounded by said annular member, said second resin layer being transparent to infrared radiation having a wave length within a predetermined range.

25. An infrared radiation detecting apparatus in accordance with claim 24, wherein said first layer is made of porous resin.

26. An infrared radiation detecting apparatus in accordance with claim 25, wherein said porous resin is thermo setting resin.

27. An infrared radiation detecting apparatus in accordance with claim 24, wherein said second resin layer is made of paraffin resin.

28. An infrared radiation detecting apparatus in accordance with claim 24, wherein said annular member has an inner and an outer surface, and wherein said second resin layer is formed in contact with said inner surface of said annular member and with said radiation receiving surface of said pyroelectric effect device means.

29. An infrared radiation detecting apparatus in accordance with claim 24, wherein said second resin layer is formed spaced apart from said radiation receiving surface of said pyroelectric effect device, whereby a space is formed which is defined between said second resin layer and said radiation receiving surface of said infrared radiation sensing device means.

30. An infrared radiation detecting apparatus in accordance with claim 24, which further comprises field effect transistor means electrically connected to said pyroelectric effect device means for impedance conversion and amplification of said electrical signal; said field effect transistor means being electrically connected both to said first electrode means and to said external connection lead means, for amplifying said electrical signal and for providing said electrical signal to said external connection lead means; said first resin layer covering said field effect transistor means.

31. An infrared radiation detecting apparatus in accordance with claim 24, wherein said external connection lead means are secured to said radiation receiving surface of said pyroelectric effect so as to extend in the direction normal to said radiation receiving surface of said pyroelectric effect device means.

32. An infrared radiation detecting apparatus in accordance with claim 24, wherein said external connection lead means are secured to said pyroelectric effect device means so as to extent parallel to said radiation receiving surface of said pyroelectric effect device means.

33. An infrared radiation detecting apparatus in accordance with claim 24, wherein said external connection lead means comprise a flexible insulated lead wire.

34. An infrared radiation detecting apparatus in accordance with claim 24, wherein said annular member is made of a porous material.

35. An infrared radiation detecting apparatus in accordance with claim 34, wherein said porous material comprises a ceramic material.

36. An infrared radiation detecting apparatus in accordance with claim 24, wherein said annular member is disposed directly on said insulating substrate.

37. An infrared radiation detecting apparatus in accordance with claim 24, wherein said annular member is disposed directly on said infrared radiation sensing device.

38. An infrared radiation detecting apparatus in accordance with claim 24, wherein said annular member is disposed on said insulating substrate with a spacing therebetween.

39. An infrared radiation detecting apparatus in accordance with claim 24, wherein said annular member is disposed on said infrared radiation sensing device with a spacing therebetween.

40. An infrared radiation detecting apparatus in accordance with claim 1 or claim 24, wherein said annular member is opaque.

41. An infrared radiation detecting apparatus in accordance with claim 1 or claim 24, wherein said second resin layer covers all of said first resin layer.

42. An infrared radiation detecting apparatus in accordance with claim 1 or claim 24, wherein said second resin layer covers only a portion of said first resin layer.

* * * * *